(12) United States Patent
Farrell

(10) Patent No.: US 8,159,356 B2
(45) Date of Patent: Apr. 17, 2012

(54) FLAME DETECTION AND SUPPRESSION SYSTEM USING A THERMOELECTRIC GENERATOR

(75) Inventor: Tom Farrell, Lawrence, KS (US)

(73) Assignee: Fike Corporation, Blue Springs, MO (US)

( * ) Notice: Subject to any disclaimer, the term of this patent is extended or adjusted under 35 U.S.C. 154(b) by 441 days.

(21) Appl. No.: 12/496,858

(22) Filed: Jul. 2, 2009

(65) Prior Publication Data

US 2010/0001865 A1 Jan. 7, 2010

Related U.S. Application Data

(60) Provisional application No. 61/078,131, filed on Jul. 3, 2008.

(51) Int. Cl.
*G08B 21/00* (2006.01)
(52) U.S. Cl. .......................................... 340/577; 431/13
(58) Field of Classification Search .................. 340/577, 340/584; 169/46; 110/185, 235, 236; 431/13–16
See application file for complete search history.

(56) References Cited

U.S. PATENT DOCUMENTS

| | | | |
|---|---|---|---|
| 4,209,291 A * | 6/1980 | Gandolfi et al. | 431/16 |
| 2009/0120336 A1* | 5/2009 | Chapin et al. | 110/236 |
| 2011/0186022 A1* | 8/2011 | Johnston et al. | 123/597 |

FOREIGN PATENT DOCUMENTS

| | | |
|---|---|---|
| JP | 2002119747 A | 4/2002 |
| KR | 1020010073937 A | 8/2001 |
| KR | 1020010081344 A | 8/2001 |
| KR | 102007004177 A | 4/2007 |

OTHER PUBLICATIONS

PCT Written Opinion of the International Searching Authority dated Mar. 8, 2010 for Application No. PCT/US2009/049488, filed Jul. 2, 2009; Applicant: Fike Corporation et al. (4 pages).
PCT International Search Report dated Mar. 8, 2010 for Application No. PCT/US2009/049488, filed Jul. 2, 2009; Applicant: Fike Corporation et al. (7 pages).

* cited by examiner

*Primary Examiner* — Jeffery Hofsass
(74) *Attorney, Agent, or Firm* — Hovey Williams LLP

(57) ABSTRACT

Apparatus and methods for protecting process equipment from a fire and/or an explosion are provided. In particular, the apparatus and methods utilize Seebeck sensors or thermoelectric generators to detect the propagation of a flame front or deflagration wave within the process equipment. Upon detection of the deflagration wave, the system controller activates mitigation apparatus which may be in the form of a chemical suppressant or isolation valves in order to protect the process equipment from damage.

28 Claims, 10 Drawing Sheets

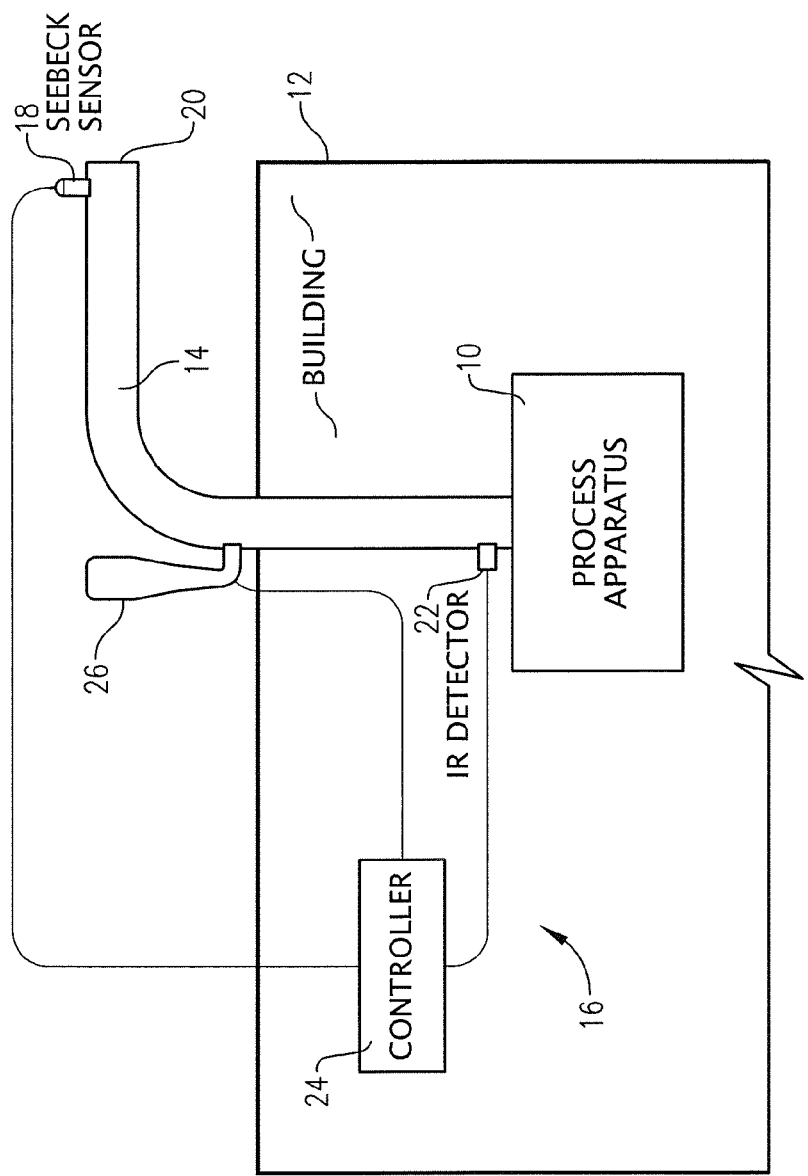
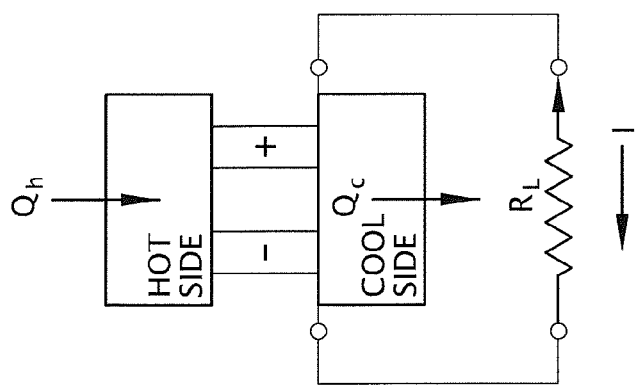
FIG. 3
FIG. 2

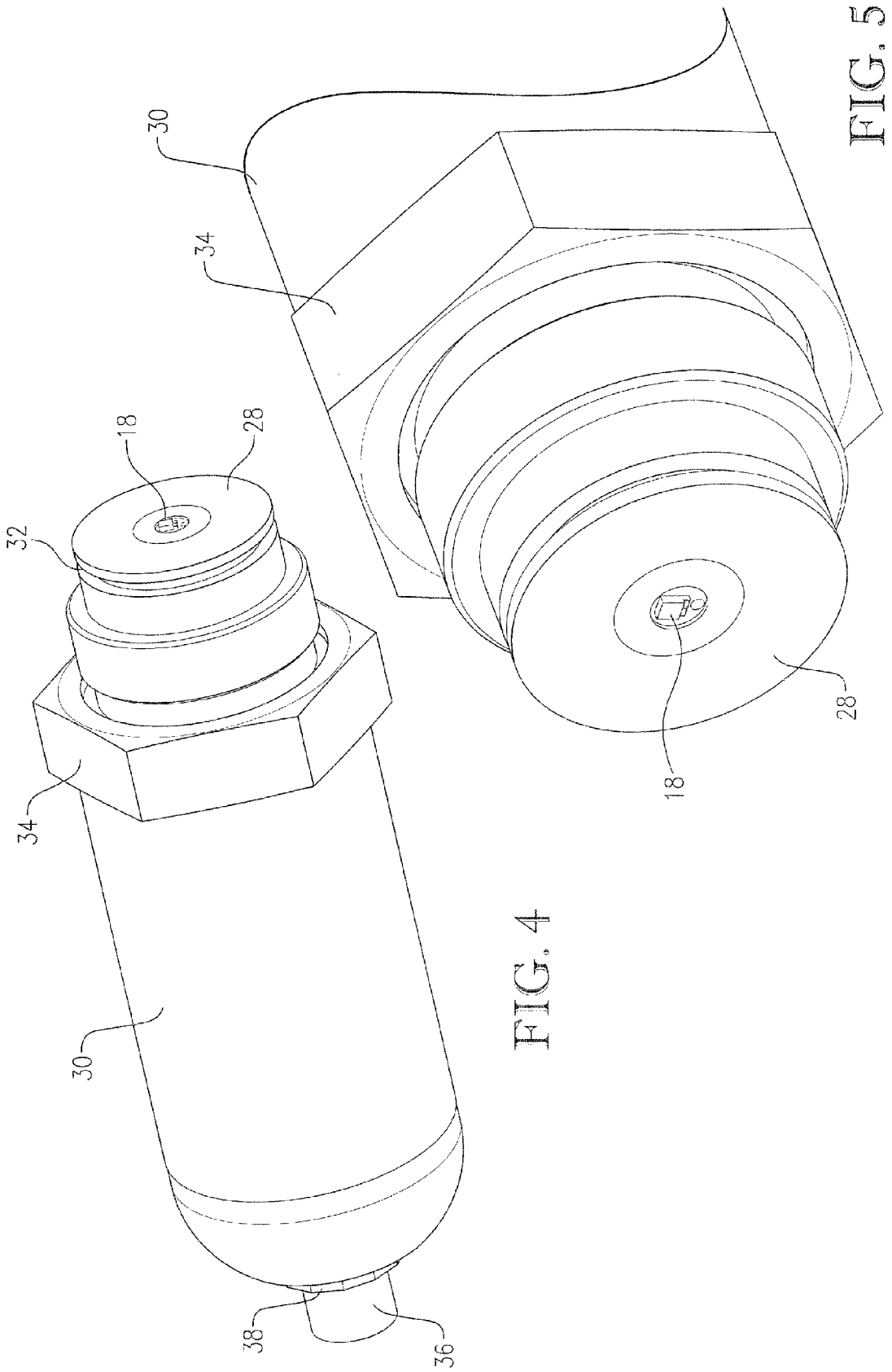

FLAME DETECTION AND SUPPRESSION SYSTEM USING A THERMOELECTRIC GENERATOR

RELATED APPLICATION

The present application claims the benefit of U.S. Provisional Patent Application No. 61/078,131, filed Jul. 3, 2008, which is incorporated by reference herein in its entirety.

BACKGROUND OF THE INVENTION

1. Field of the Invention

The present invention is generally directed toward the use of Seebeck devices in fire suppression and explosion prevention systems. Generally, the Seebeck devices are placed within processing equipment such as vessels and connecting pipelines and are used for detecting the flame front of an explosion. Upon detection of the flame front, the system activates a suppression mechanism that, for example, releases a suppression agent or closes valves to prevent the fire or explosion from propagating into surrounding or interconnecting equipment.

2. Description of the Prior Art

Dust explosions are an unfortunate but real problem when processing combustible materials. In many instances, the efficacy of an explosion mitigation system depends on the type of dust involved.

Conventional explosion suppression systems generally employ optical sensors to "visually" detect a flame within processing equipment. Optical sensors, which most commonly detect infrared radiation, are fairly simple and inexpensive devices. Optical sensors are advantageous in that they give fast response time, however these sensors also exhibit some notable shortcomings. Optical sensors can be subject to "stray" radiation, thus they cannot be used at or near duct outlets where the sensors might be exposed to ambient light. Further, the sensors can become "blinded" by dust generated within the processing equipment.

Pressure sensors can also be used to detect a pressure front generated by an explosion. However, much like the optical sensors, pressure sensors do not work well at or near duct outlets as pressure fronts cannot develop.

Ionization detectors, which have conventionally been used in various types of smoke detectors, also present certain shortcomings. Most notably, ionization detectors do not directly measure the flame and have limited survivability.

SUMMARY OF THE INVENTION

In one embodiment, the present invention is directed toward a fire and/or explosion protection system for use with process equipment. The system comprises at least one detector for signaling the detection of a flame within the process equipment. The at least one detector comprises two opposed substrates and an array of thermoelectric leg pairs located therebetween. The at least one detector generates an electrical signal in response to a temperature differential between the substrates created by a deflagration wave. The system also comprises a processor for receiving and analyzing the electrical signal from the at least one detector, and mitigation apparatus actuated by the processor in response to the electrical signal from the at least one detector.

In another embodiment of the present invention there is provided a method of detecting a deflagration wave within process equipment. The method comprises positioning within the process equipment at least one detector comprising two opposed substrates and an array of thermoelectric leg pairs located therebetween. The at least one detector generates an electrical signal in response to a temperature differential created by the deflagration wave.

In yet another embodiment according to the present invention there is provided a method of protecting process equipment from a fire and/or explosion. The method comprises positioning at least one detector within the process equipment, the at least one detector comprising two opposed substrates and an array of thermoelectric leg pairs located therebetween. The detector is used to detect the presence of a deflagration wave by generating an electrical signal in response to a temperature differential between the substrates created by the deflagration wave. The signal is transmitted to a control unit comprising a processor. The processor receives the signal and actuates mitigation apparatus in response thereto.

BRIEF DESCRIPTION OF THE DRAWINGS

FIG. 2 is a schematic diagram of a thermoelectric leg pair which illustrates the Seebeck effect;

FIG. 3 is a schematic diagram of an exemplary fire/explosion suppression system employing a Seebeck sensor;

FIG. 4 is a perspective view of an exemplary Seebeck sensor device for use in a fire/explosion suppression system;

FIG. 5 is a close-up view of the portion of the device from FIG. 4 comprising, the Seebeck sensor;

DETAILED DESCRIPTION OF THE PREFERRED EMBODIMENT

Detectors for use with the present invention are known as thermoelectric generators (TEG), Seebeck sensors, or Peltier coolers, terms that are used interchangeably below. TEGs used in accordance with the present invention take advantage of the Seebeck effect which is the conversion of temperature differences directly into electricity. A voltage, the thermoelectric EMF, is created in the presence of a temperature difference between two different metals or semiconductors and can be used to create a continuous current. The Seebeck effect is contrasted with the Peltier effect which produces cooling if a power source is provided to a thermoelectric device.

Figure 1:
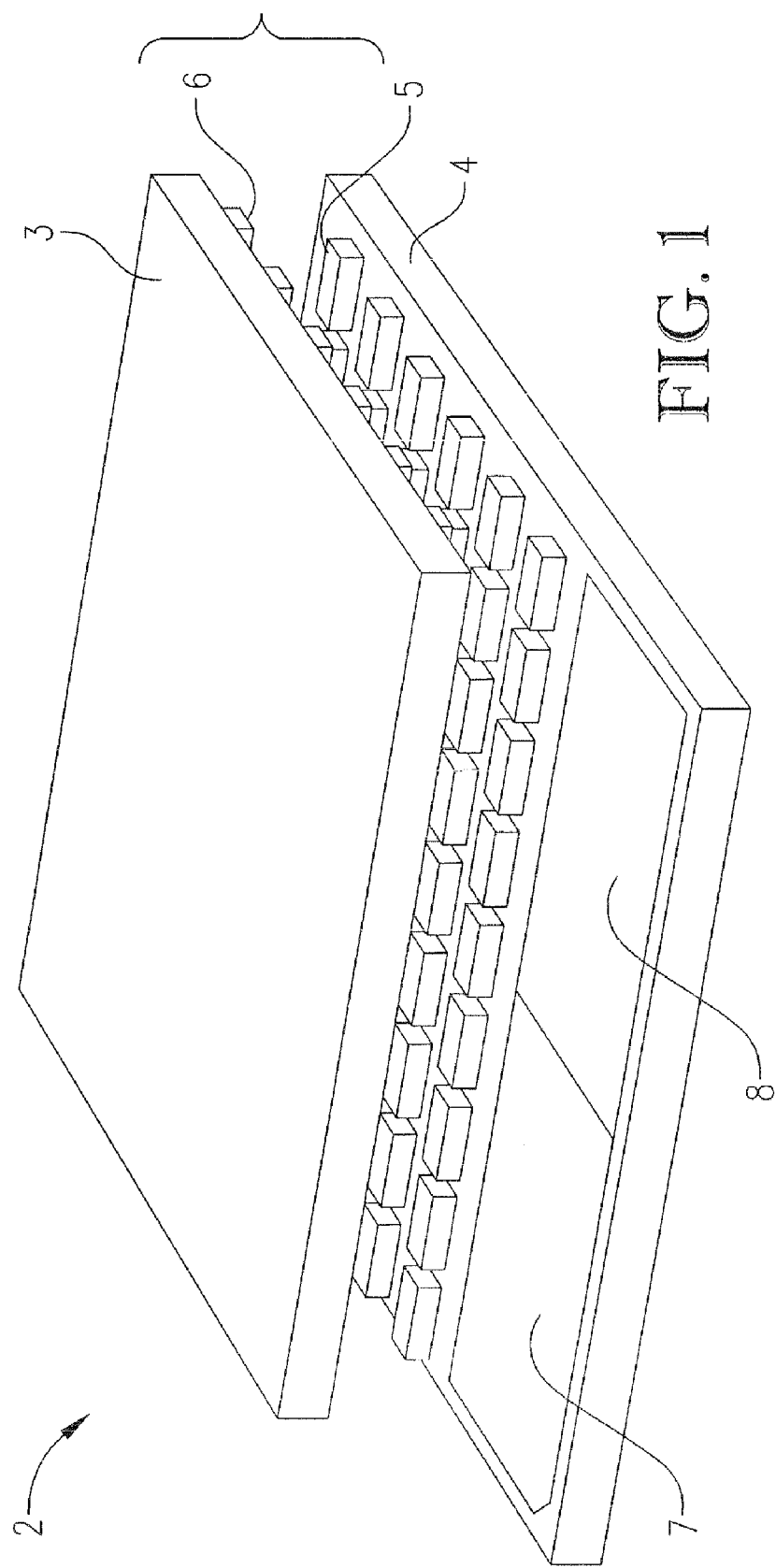
FIG. 1 illustrates an exemplary Seebeck sensor that may be used in accordance with the present invention.

In certain embodiments, the TEGs comprise hundreds of micro-sized thermocouples (each thermocouple comprising an individual thermoelectric leg pair) disposed between two opposed substrates. An exemplary TEG device is illustrated in FIG. 1 and described in further detail below. These devices are operable to convert heat differentials between an upper and lower surface or substrate into electrical currents. FIG. 2 schematically illustrates an exemplary thermoelectric leg pair and the generation of a voltage due to a temperature differential between "hot" and "cool" of the devices. The ensuing voltage can be used to a current that is passed through a load.

As shown in FIG. 1, TEG device 2 comprises a pair of opposed silicon substrates 3 and 4. Sandwiched between substrates 3 and 4 are a plurality of negative legs 5 and positive legs 6 which comprise one or more materials selected from the group consisting of Bismuth (Bi), Antimony (Sb), Tellurium (Te), and Selenium (Se). In certain embodiments, the legs comprise $Bi_2Te_3$ materials. The legs are connected to a positive contact 7 or a negative contact 8, respectively. Exemplary TEG devices that may be used with the present invention are available from Micropelt GmbH, Frieburg, Germany.

The density of the thermoelectric leg pairs on the TEG device may also affect the efficacy of the device for use in detecting deflagration waves. In certain embodiments, the TEGs comprise at least 40 thermoelectric leg pairs per square millimeter. In other embodiments, the TEGs comprise at least 75 leg pairs/mm$^2$, in yet other embodiments at least 100 leg pairs/mm$^2$, and in still other embodiments at least 150 leg pairs/mm$^2$. In one particularly preferred embodiment, the TEGs comprise about 77 leg pairs/mm$^2$. In alternate embodiments of the present invention, the TEGs are present at a density of between about 40 to about 500 leg pairs/mm$^2$, or between about 50 to about 400 leg pairs/mm$^2$, or between about 70 to about 300 leg pairs/mm$^2$.

In certain embodiments of the present invention, the TEGs are very thin, micro-sized devices with each substrate presenting a sensing plane area (i.e., the area of the TEG which the thermoelectric leg pairs occupy) of less than 25 mm$^2$. In one particular embodiment, the sensing plane area of each substrate is about 6.25 mm$^2$. Each substrate also has a thickness of less than 600 microns. In certain embodiments this thickness is less than 500 microns, or less than 250 microns, or less than about 200 microns. In still other embodiments, the substrate thickness is between about 1 to about 600 microns, or between about 5 to about 500 microns, or between about 10 to about 250 microns. Thus, the TEGs are capable of unobtrusive use at virtually any location within the processing equipment.

The physical dimensions of the TEGs contribute to the extremely low response times provided thereby. By "response time" it is meant the time for the TEG to reach its peak output from null. The TEGs for use with the present invention generally exhibit response times of less than 10 ms. In certain embodiments, the response time can be less than 5 ms, or even less than about 2.5 ms. In still other embodiments, the response time can be between about 0.01 to about 10 ms, or between about 0.1 to about 5 ms, or between about 0.5 to about 2.5 ms. One particular embodiment of the TEG for use with the present invention presents a substrate thickness of 210 μm and a sensing time of approximately 2.2 ms. This is contrasted with many conventional heat flux sensors that exhibit response times on the order of 10 ms or more.

FIG. 3 schematically depicts the usage of a Seebeck sensor in an exemplary fire/explosion suppression system. Process apparatus 10 is located within a building 12 and includes an exhaust conduit 14 (typically a duct or pipeline) to allow for venting of the process apparatus to the atmosphere surrounding building 12. Note, that in alternate embodiments conduit 14 could operably connect apparatus 10 with additional process equipment. A fire/explosion suppression system 16 is shown including a Seebeck sensor 18 installed proximate the outlet 20 of conduit 14, and a traditional infrared or optical detector 22 installed proximate the inlet of conduit 14. Both the Seebeck sensor 18 and the infrared detector 22 are operably connected to a controller 24. The connection between sensor 18, detector 22 and controller 24 can be wired or wireless depending upon the particular application. Fire/explosion mitigation apparatus 26 is also located on conduit 14 and operably connected to controller 24. As shown mitigation apparatus 26 is a container holding a suppressant agent (including but not limited to water, powder and gaseous suppressants, or hybrids thereof) and is coupled to conduit 14 so as to be capable of introducing the suppressant agent into the same. It is understood, however, that mitigation apparatus 26 may comprise alternate devices including a mechanical isolation valve (including but not limited to high speed gate valves, pinch valves or other fast acting valves) or a chemical isolation system. It is noted also that additional sensors of the Seebeck type and/or traditional optical or pressure detectors could be installed at various locations throughout the apparatus to be protected. Additionally, the Seebeck sensors do not need to be used in conjunction with other types of detectors, as it is within the scope of the present invention for the suppression system 16 to comprise only Seebeck sensors.

In operation, Seebeck sensor 18 and optical detector 22 continually passively monitor conduit 14 for signs indicative of an imminent fire or explosion. Optical detector 22 is used primarily to detect the presence of or a change in the intensity of infrared light, for example, at a particular location in the conduit that may be indicative of an imminent fire or explosion. Detector 22, however, would not be effective in this function if it were positioned a location near outlet 20 as the ambient light, and possibly dust or debris, entering conduit 14 from the environment outside building 12 may interfere with the ability of detector 22 to detect and signal the presence of a developing fire or explosion. Seebeck sensor 18, however, is not subject to these same shortcomings. Rather sensor 18 is operable to detect a flame front or deflagration wave (essentially the heat component of the flame front) by virtue of a temporary temperature gradient that the deflagration wave would create between the sensor's opposed substrates.

As a flame front or deflagration wave passes by and contacts Seebeck sensor 18 within conduit 14, a temperature gradient is created between the sensor's substrates thereby generating an electrical current or signal that is transmitted to controller 24. The electrical signal may or may not be amplified en route to controller 24.

Upon detection of a signal indicative of the presence of a flame front or deflagration wave within conduit 14, controller 24 can activate mitigation apparatus 26 thereby releasing a suppressant agent into conduit 14 to extinguish the fire or suppress an imminent explosion. As noted above, mechanical or chemical isolation equipment can also be used in place of or in addition to the suppressant agent of mitigation apparatus 26 in order to prevent the fire or explosion from propagating into other interconnected process equipment.

The TEG devices are contrasted with thermopile devices that are used to measure heat flux. Unlike a thermopile, thin film thermoelectric generators only produce an electric current in response to a dynamic temperature differential. Once the temperature differential between opposite sides of the device no longer exists, the device no longer produces a voltage. The TEG device is insensitive to sustained elevated temperatures (high process temperatures will be ignored by the sensor) as the device will reach thermal equilibrium at the elevated temperature and only respond when that temperature changes rapidly, as in the case of an explosion or flame passage. This eliminates the need for electronics which discern between stable ambient conditions and rapidly changing ambient conditions.

Since Seebeck sensors are generally constructed from series-wired thermocouples, they exhibit the same favorable levels of EMI/RFI immunity that are characteristic of thermocouples. In addition, TEG devices are able to detect the thermal signature characteristic of flame without requiring lenses for focusing. No excitation current or voltage is required since the sensor generates its own power from heat available from the flame being detected. As described above, TEG devices are particularly suited to sense explosions or flames in unconfined spaces where substantial pressure will not develop, such as in vented vessels and duct/pipe outlets, and in locations within the process equipment that may be exposed to ambient light (solar, fluorescent, incandescent, etc.).

In one embodiment of the present invention, and as shown in FIGS. 4 and 5, a sensor device 18 in accordance with the present invention comprises a TEG 2 that is affixed to the end 28 of a plug 30 which provides a reference thermal mass to maintain a nearly constant temperature for TEG 2. Plug 30 is configured so that it may be installed through the sidewall of conduit 14. When sensor device 18 is installed, end 28 is exposed to the interior of conduit 14 so that TEG 2 will be in position to detect the flame front or deflagration wave that is indicative of an imminent fire or explosion. The portion of TEG 2 that is not exposed to the interior of conduit 14 may optionally be covered with a highly thermally conductive and electrically insulating epoxy. The epoxy provides thermal and structural connection between plug 30 and TEG 2. Plug 30 also comprises threads 32 to facilitate securing of plug 30 to conduit 14. A hex-shaped segment 34 is also included so that a wrench may be used to assist in securing plug 30 to conduit 14. Cable 36 extends from the distal end 38 of plug 30 and carries the electrical signal generated by TEG 2 to, for example, controller 24.

In certain embodiments of the present invention, the electrical output of TEG 2 is carried by thin wires through small holes in the plug 30 and are connected to a PCB which conditions the signal through, for example, amplification and/or conversion into a ratiometric 4-20 mA current. Although, as noted above, the signal strength from the TEG is such that amplification of the signal is not necessarily required.

EXAMPLES

In the present examples, the performance of two sizes of TEG devices were tested and compared with a conventional optical sensors. It was discovered that the TEG devices exhibited excellent response times making them very well suited for use in fire/explosion suppression systems.

Two TEG devices supplied by Micropelt GmbH, Frieburg, Germany, were tested. The first device had a thickness of 520 microns per substrate (20 mils, 41 mils overall height), designated "standard MPG-602," and the second device had a thickness of 200 microns per substrate (7.9 mils, 16 mils overall height), designated "200 μm MPG-602." The response times of the TEG devices were tested to determine their suitability for use in fire suppression and explosion prevention systems. Each device was mounted onto the end of a ⅛ inch NPT stainless steel plug to provide an attachment mechanism and a thermal mass for reference temperature.

Prior to performing the experiments, it was theorized that the thickness of the TEG substrate would be a limiting factor in the response time of the device considering that the thermal resistivity of the substrate material, silicon, is considerably higher than that of the sensing plane materials (Bismuth, Antimony, Tellurium, and Selenium). By decreasing the thickness of the element substrate, it was expected that the response time, or time for the TEG to reach its peak output from first deviation from null, would decrease. However, it was unclear what the magnitude of the change in response time would be. There was also a concern that there would be an accompanying reduction in maximum signal output by reducing the substrate thickness. In order to test these theories, both the standard TEG and the reduced thickness TEG were tested simultaneously to ensure similar stimulus for each TEG.

Both TEG's were placed 90 degrees apart (45 degrees each from vertical) at the same axial location of a 4 inch diameter polycarbonate tube. This axial station was approximately one diameter from the exit of the pipeline. Methane and air were injected into the opposing end of the pipeline, creating a mixture of approximately 5.3% methane in air (equivalence ratio of approximately 0.56) throughout the entire 12 foot pipeline. This end was initially sealed with cellophane to facilitate filling. After a several second delay to allow any residual turbulence in the pipeline to dissipate (residuals of the filling process), the mixture was ignited near the filling location by means of an electrically generated spark. The heat from this ignition, as well as initial heat generated by the ensuing deflagration, burned the cellophane seal open, providing an escape path for combustion gases. This allowed a flame front to travel the length of the pipeline in an unforced, near-laminar fashion, generating a low-luminescence flame front with an estimated adiabatic flame temperature of approximately 1600 K (1327° C.).

Turbulent conditions were tested in the same manner, with a small washer installed four feet upstream of the test section containing the TEG's. This washer generates turbulence in the pipeline as the flame front approaches, as combustible mixture is forced ahead of it by pressure developing in the pipeline. This turbulence increases the rate at which the flame propagates through the test section, reducing the amount of time the each TEG will "see" flame.

Laminar Deflagration

Figure 6:
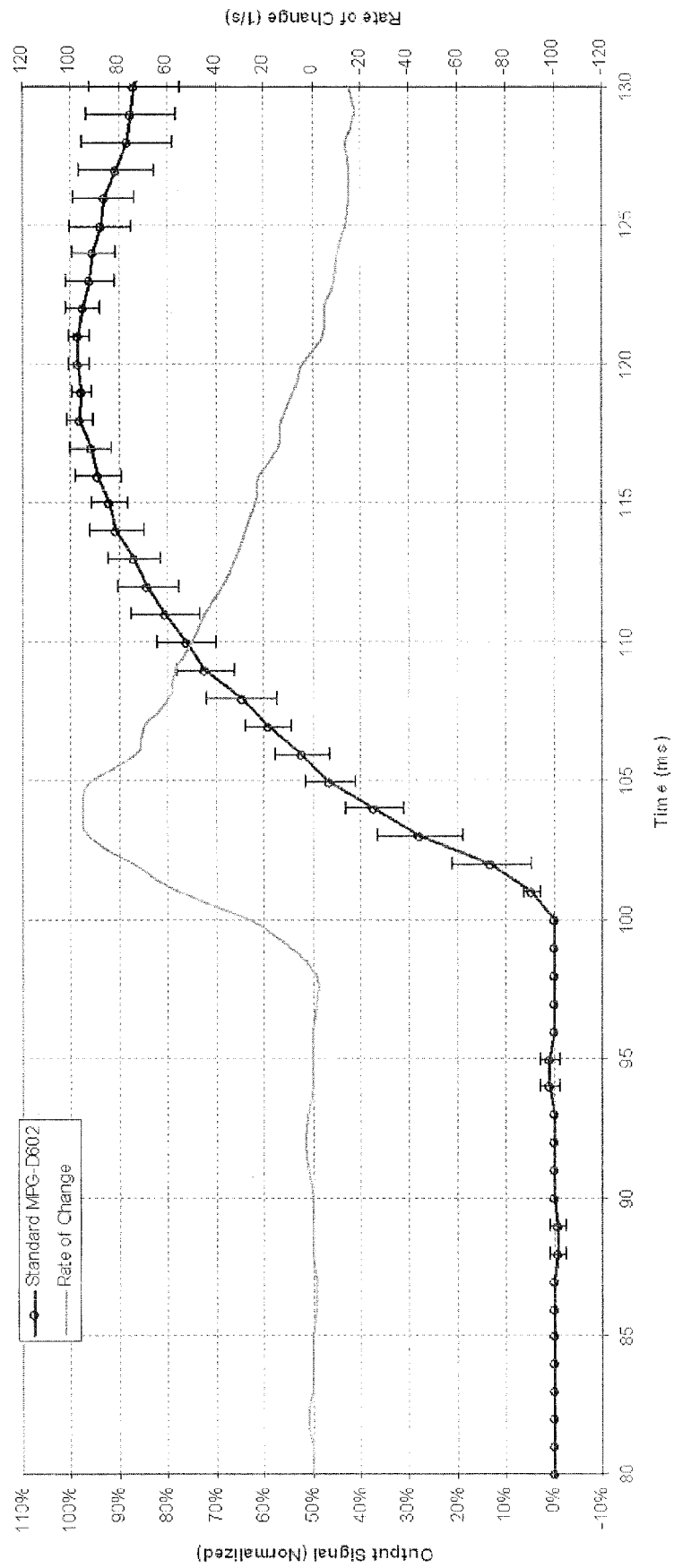
FIG. 6 is a chart illustrating the response time under laminar conditions for a "standard" TEG device that may be used with the present invention.

Five tests were conducted in the laminar combustion configuration. The results of these tests were normalized (to their own respective maxima) and then averaged to obtain a representative response waveform. The response waveform of the standard TEG, as well as its accompanying rate of change, is shown in FIG. 6. As can be seen in this plot, the standard TEG responds initially with a high rate of change.

Figure 7:
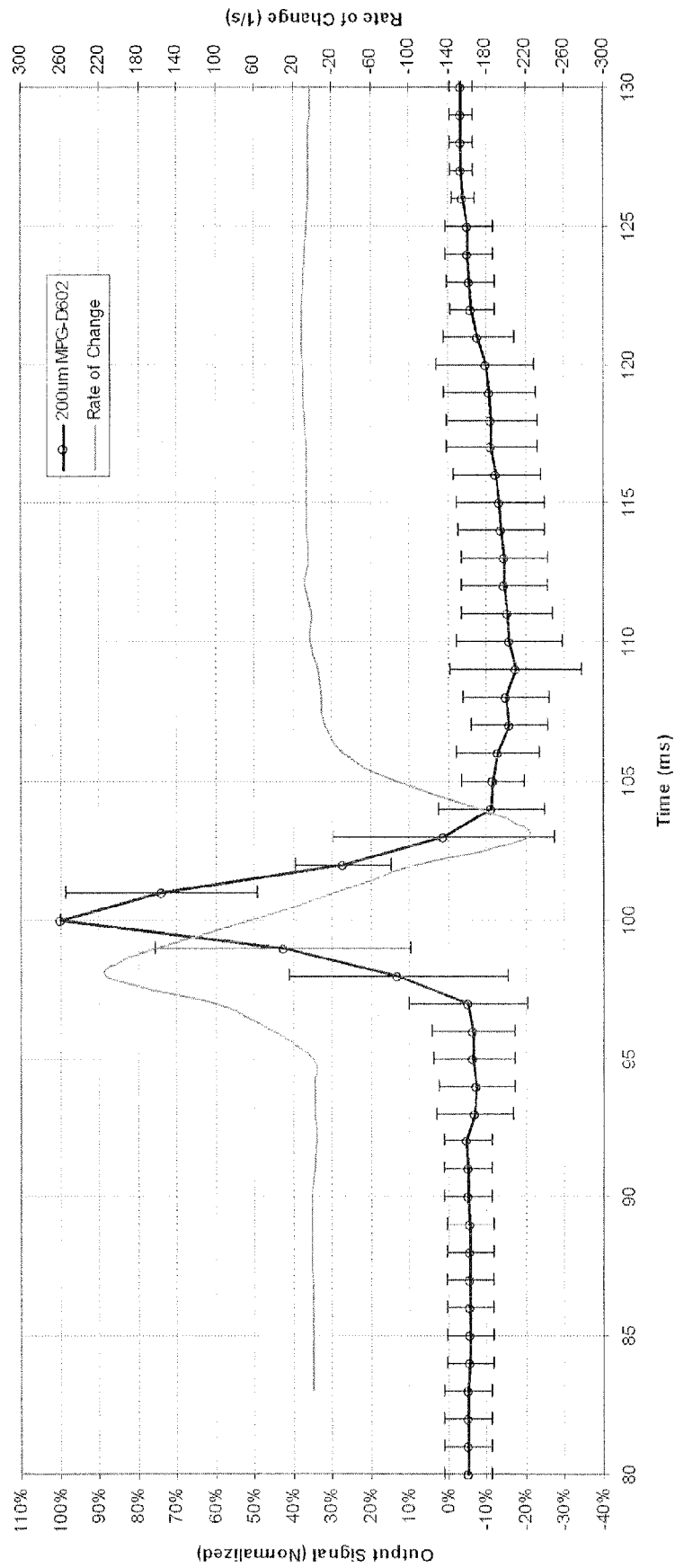
FIG. 7 is a chart illustrating the response time under laminar conditions for a "reduced thickness" TEG device that may be used with the present invention.

The response curve of FIG. 7 (also generated from 5 different test series averages) for the reduced thickness TEG showed a very surprising response to the same stimulus. This response curve shows an increase in maximum response rate of 2.2 times that of the standard thickness TEG. It reached a peak output value at approximately 3 ms, and returned in another 3 ms. The time that it takes for each waveform to reach its peak output is also noteworthy. The standard TEG reaches its peak in 20 ms and the reduced thickness TEG reaching its peak in approximately 3 ms. If this is considered to be the response time of the TEG's, then the reduced thickness TEG has a response rate of approximately 6.7 times faster.

The thinner TEG also showed evidence of heat rejection after about 7 ms (shown on the chart at time 107 ms), which may indicate measurement of post-combustion evaporative cooling and/or forced convection cooling of the surface of the TEG as a result of turbulence generated by the deflagration itself.

Figure 8:
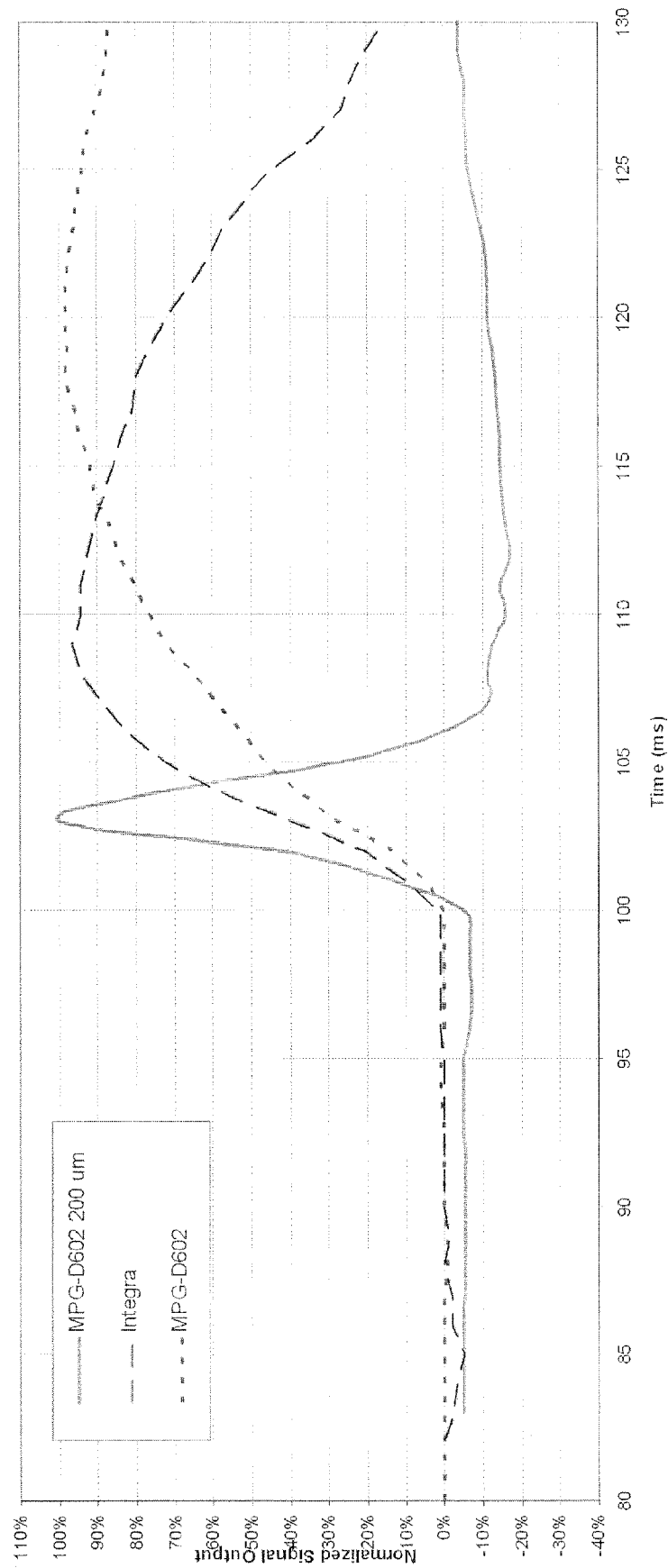
FIG. 8 is a chart comparing the response times for two TEG devices and a conventional optical flame detector.

The output wave forms of the two TEG devices was then compared to the output wave form of the Integra detector sensing element (an optical infrared detector available from Fike Corporation, also referred to as an IREX or Integra sensor) as shown in FIG. 8. There are several distinct differences between these waveforms, the most notable being the sharp response and return to null value of the reduced thickness TEG. While the Integra detector sensing head "sees" the flame front both before and after the flame is actually directly in front of the sensor, the TEGs do not. They only respond when flame is actually in contact with the TEG face which makes them a far more responsive flame detector.

The data presented in FIG. 8 is time-aligned from test to test to achieve statistically significant output waveforms and does not speak to the difference in activation times. It was discovered that on average, in the laminar tests, the reduced thickness TEG began to respond to the flame front 8 ms before the standard TEG, thus confirming the theory that responsiveness is a function of thermal heating requirements of the TEG. It was also discovered that the standard thickness TEG responded 8.4 ms after the Integra detector sensing element. It is believed that this is largely attributable to the viewing angle of the Integra detector.

Turbulent Deflagration

Figure 9:
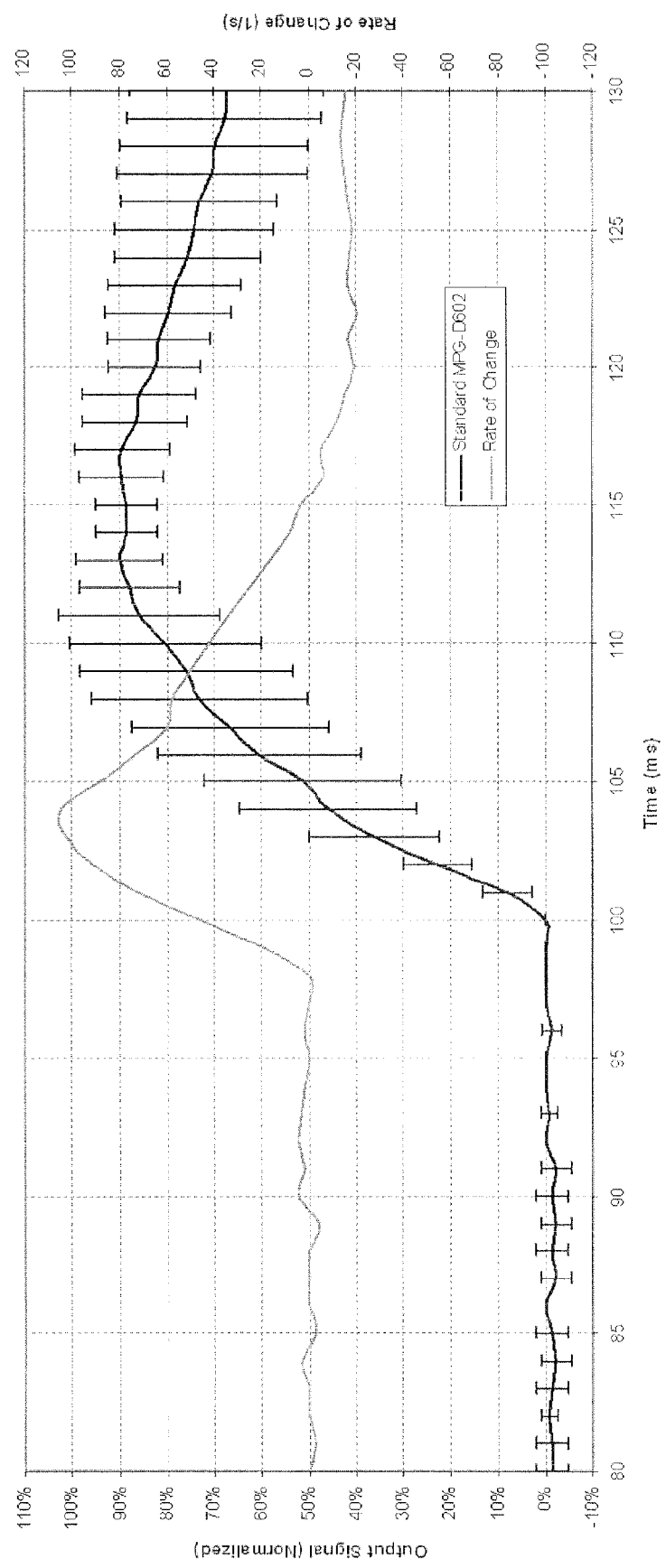
FIG. 9 is a chart illustrating the response time under turbulent conditions for the "standard" TEG device that may be used with the present invention.
Figure 10:
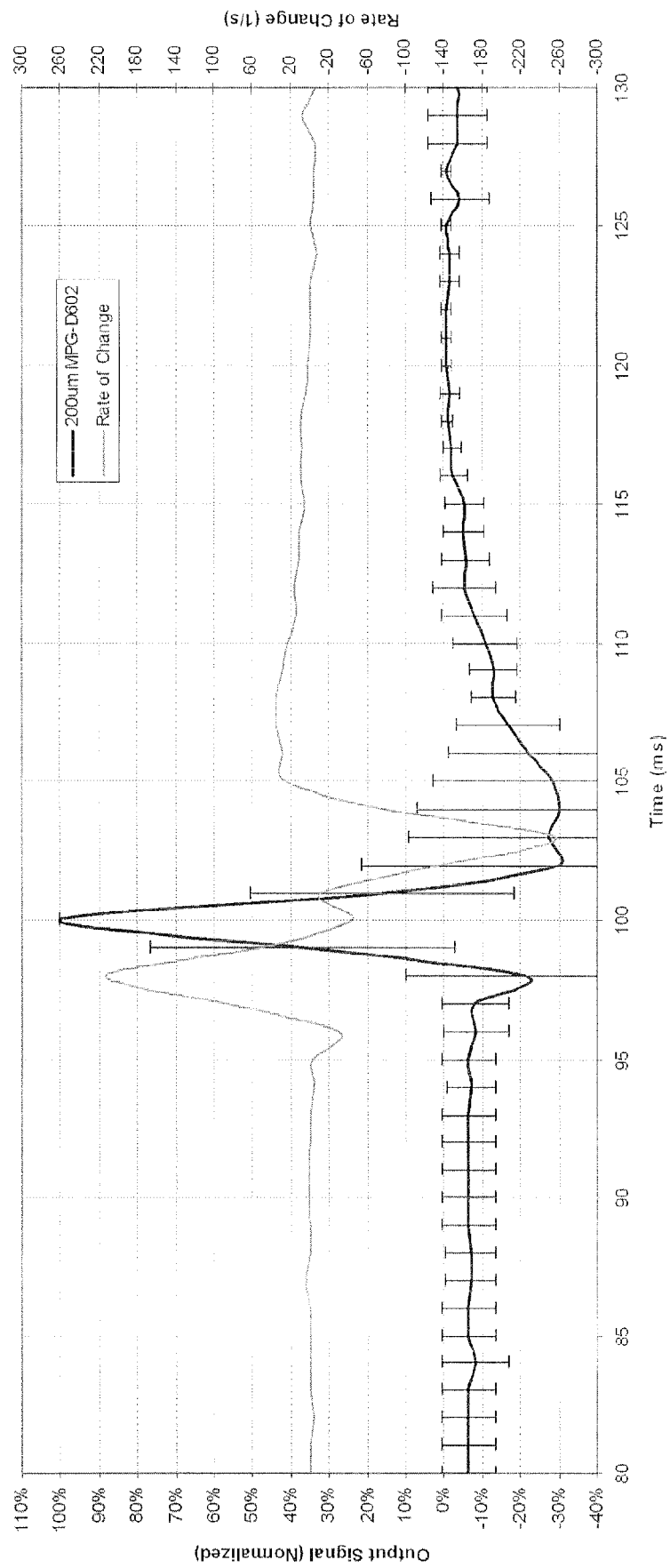
FIG. 10 is a chart illustrating the response time under turbulent conditions for the "reduced thickness" TEG device that may be used with the present invention.

These tests were repeated in the turbulent combustion configuration, and similar results were obtained. The results are shown in the plots of FIGS. 9 and 10. Surprisingly, the waveform for the reduced thickness TEG reached its peak output value in only 2 milliseconds, and returned below null in 2 milliseconds, thereby also exhibiting the cooling region following the flame passage. This appears consistent with the phenomena of the flame width and propagation speed. The reduced thickness TEG also began to respond approximately 2 ms before the standard TEG on average.

Power Delivery

Figure 11:
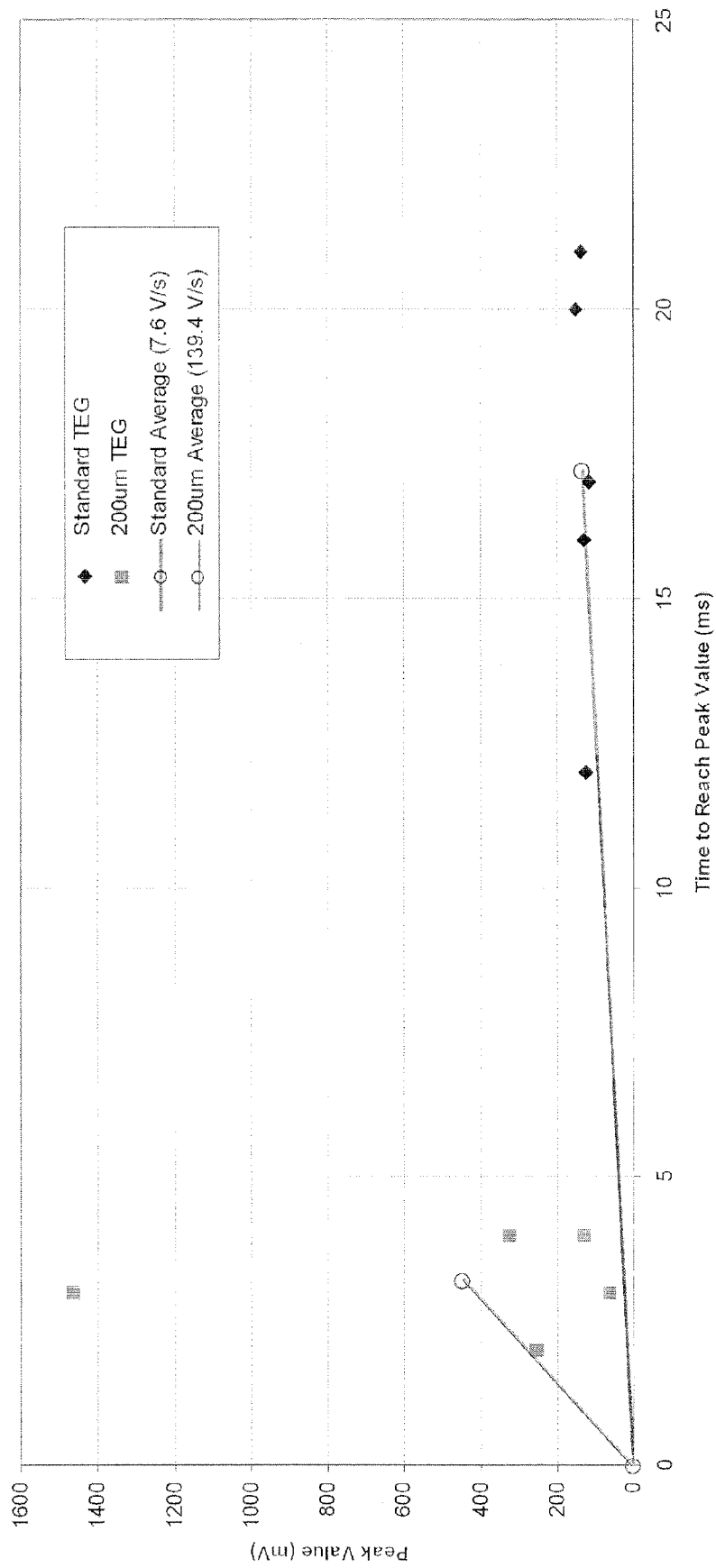
FIG. 11 is a chart comparing the rate and magnitude of the signal generated from the TEG devices under laminar conditions.
Figure 12:
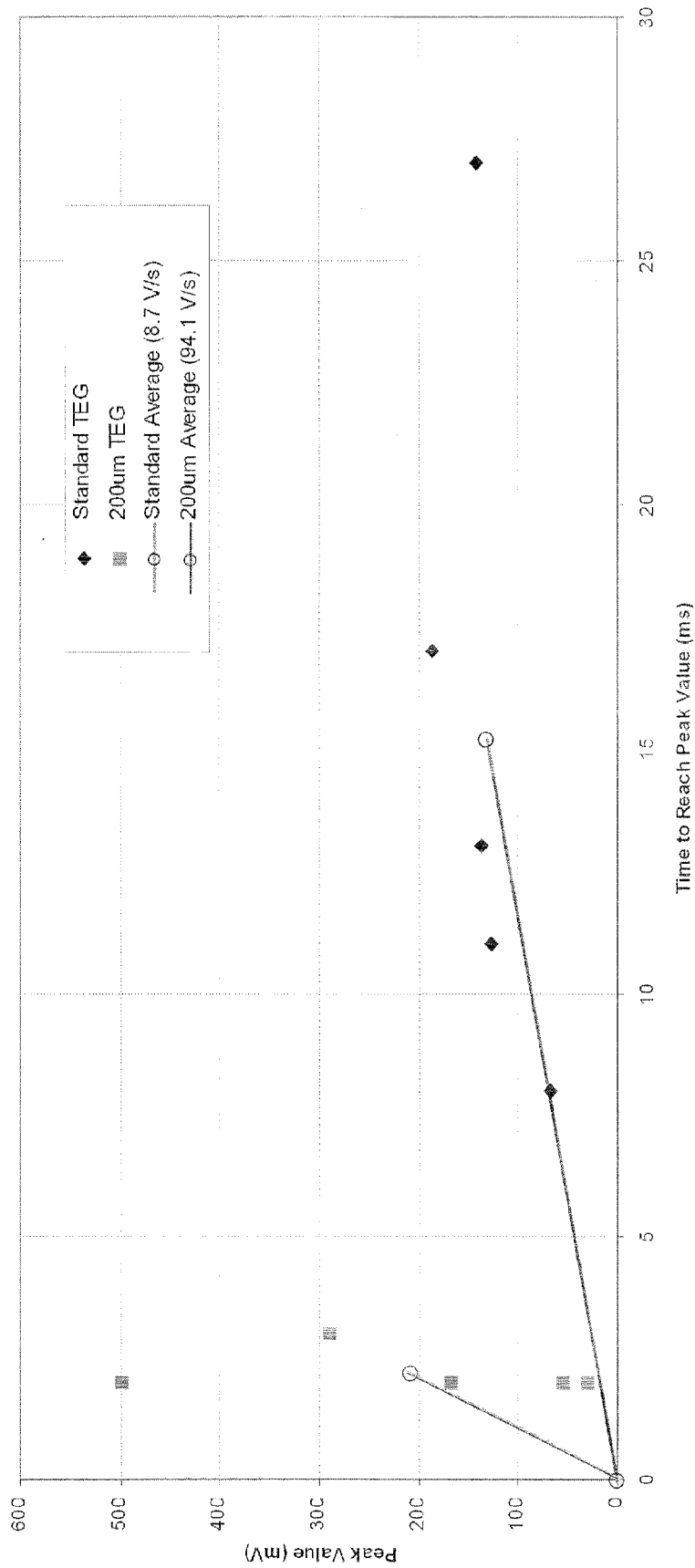
FIG. 12 is a chart comparing the rate and magnitude of the signal generated from the TEG devices under turbulent conditions.

In order to determine the effect of thickness upon peak output values and response time, these parameters were plotted for all tests. As can be seen in FIGS. 11 and 12, a reduction in thickness not only increased the rate of change (thereby decreasing the response time) of the TEG, it also unexpectedly increased the output value. It is believed that this phenomenon can be explained by the thermal gradient existing within the TEG itself. By reducing the overall thickness of the device, and maintaining the same temperature difference across the device, a greater temperature difference exists across the sensing plane of the TEG. Since the TEG functions by converting the temperature difference existing across its sensing plane into a voltage, this would account for the increase in output signal levels. Also, since there is less thermal mass to heat during a deflagration, this thermal gradient is expected to develop and stabilize much faster in the thinner substrates.

I claim:

1. A fire and/or explosion protection system for use with process equipment, said system comprising:
    at least one detector for signaling the detection of a flame within the process equipment, said at least one detector comprising two opposed substrates and an array of thermoelectric leg pairs located therebetween, said at least one detector for generating an electrical signal in response to a temperature differential between said substrates created by a deflagration wave;
    a processor for receiving and analyzing the electrical signal from said at least one detector; and
    mitigation apparatus actuated by said processor in response to the electrical signal from said at least one detector.

2. The system according to claim 1, wherein said at least one detector has a thermoelectric leg pair density of at least 40 leg pairs/mm$^2$.

3. The system according to claim 2, wherein said at least one detector has a thermoelectric leg pair density of at least 75 leg pairs/mm$^2$.

4. The system according to claim 1, wherein said at least one detector has a response time to the deflagration wave of less than 10 ms.

5. The system according to claim 3, wherein said response time is less than 5 ms.

6. The system according to claim 4, wherein said response time is less than 2.5 ms.

7. The system according to claim 1, wherein said mitigation apparatus comprises a chemical suppressant that is introduced into said process equipment for suppressing the fire or explosion, an isolation valve for isolating portions of the process equipment, or a combination thereof.

8. The system according to claim 1, wherein said substrates each have a thickness of less than 600 microns.

9. The system according to claim 7, wherein said substrates each have a thickness of less than 500 microns.

10. The system according to claim 8, wherein said substrates each have a thickness of less than 250 microns.

11. The system according to claim 1, wherein said signal from said sensor requires no amplification before being received by said processor.

12. The system according to claim 11, wherein said signal from said sensor is converted to a ratiometric current output for transmission to said processor, said ratiometric current output being converted back to an analog voltage prior to being received by said processor.

13. The system according to claim 1, wherein said at least one detector is positioned within an area of said processing equipment that is exposed to ambient light.

14. A method of detecting a deflagration wave within process equipment comprising positioning within said process equipment at least one detector comprising two opposed substrates and an array of thermoelectric leg pairs located therebetween, said at least one detector generating an electrical signal in response to a temperature differential created by the deflagration wave.

15. The method according to claim 14, wherein said at least one detector has a thermoelectric leg pair density of at least 40 leg pairs/mm$^2$.

16. The method according to claim 14, wherein said at least one detector has a response time to the deflagration wave of less than 10 ms.

17. The method according to claim 14, wherein said substrates each have a thickness of less than 600 microns.

18. The method according to claim 14, wherein said at least one detector is positioned within an area of said processing equipment that is exposed to ambient light.

19. The method according to claim 14, wherein said at least one detector is positioned within an area of said processing equipment that is adjacent to an opening to the environment outside of said equipment.

20. The method according to claim 14, wherein said electrical signal generated by said at least one detector is used to activate mitigation apparatus.

21. The method according to claim 20, wherein said mitigation apparatus comprises a chemical suppressant for suppressing a fire or explosion that is introduced into said process equipment, an isolation valve for isolating portions of said process equipment, or a combination thereof.

22. A method of protecting process equipment from a fire and/or explosion comprising:
  positioning at least one detector within the process equipment, said at least one detector comprising two opposed substrates and an array of thermoelectric leg pairs located therebetween;
  using said at least one detector to detect the presence of a deflagration wave, said at least one detector generating an electrical signal in response to a temperature differential between said substrates created by the deflagration wave; and
  transmitting said electrical signal to a control unit comprising a processor, said processor receiving said signal and actuating mitigation apparatus in response thereto.

23. The method according to claim 22, wherein said at least one detector has a thermoelectric leg pair density of at least 40 leg pairs/mm$^2$.

24. The method according to claim 22, wherein said at least one detector has a response time to the deflagration wave of less than 10 ms.

25. The method according to claim 22, wherein said substrates each have a thickness of less than 600 microns.

26. The method according to claim 22, wherein said at least one detector is positioned within an area of said processing equipment that is exposed to ambient light.

27. The method according to claim 22, wherein said at least one detector is positioned within an area of said processing equipment that is adjacent to an opening to the environment outside of said equipment.

28. The method according to claim 22, wherein said mitigation apparatus comprises a chemical suppressant that is introduced into said process equipment, an isolation valve, or a combination thereof.

* * * * *